United States Patent
Lin et al.

(12) 
(10) Patent No.: US 6,171,978 B1
(45) Date of Patent: Jan. 9, 2001

(54) METHOD OF MANUFACTURING CAPACITOR DIELECTRIC

(75) Inventors: Shih-Chi Lin, Taipei; Fu-Jier Fahn, Hsin-Chu; Jenq-Dong Sheu, Taipei, all of (TW)

(73) Assignee: Taiwan Semiconductor Manufacturing Company, Hsin-Chu (TW)

(*) Notice: Under 35 U.S.C. 154(b), the term of this patent shall be extended for 0 days.

(21) Appl. No.: 09/320,761

(22) Filed: May 27, 1999

(51) Int. Cl.[7] .................. H01L 21/31; H01L 21/469; H01L 21/8242; H01L 21/20
(52) U.S. Cl. .................. 438/775; 438/239; 438/250; 438/253; 438/393; 438/396; 438/769; 438/954
(58) Field of Search .................. 438/239, 250, 438/253, 393, 396, 769, 775, 954

(56) References Cited

U.S. PATENT DOCUMENTS

| | | | | |
|---|---|---|---|---|
| 5,455,204 | * | 10/1995 | Dobuzinsky et al. | 438/238 |
| 5,523,596 | * | 6/1996 | Ohi et al. | 257/296 |
| 5,616,401 | * | 4/1997 | Kobayahi et al. | 428/212 |
| 5,618,747 | | 4/1997 | Lou | 438/398 |
| 6,017,791 | * | 1/2000 | Wang et al. | 438/253 |

* cited by examiner

Primary Examiner—John F. Niebling
Assistant Examiner—Jennifer M. Kennedy
(74) Attorney, Agent, or Firm—George O. Saile; Stephen B. Ackerman

(57) ABSTRACT

This invention relates to the fabrication of integrated circuit devices and more particularly to an improved, graded, silicon oxynitride process step, in order to form an unconventional dielectric layer, having an adjustable effective dielectric constant, for the purpose of fabricating capacitors for both DRAM and Logic technologies. During the special CVD process for the oxynitride layer, its composition is varied such that three distinct regions are created in the direction of film growth. The dielectric property of the lower region is close to silicon oxide, the dielectric property of the upper region is close to silicon oxynitride and the dielectric property of the intermediate transition zone is between that of silicon oxide and oxynitride. Suitable adjustment of the the relative thickness of the transition zone, of the resultant Silicon-Oxide-OxyNitride, SOON, layer, is used as a convenient means of obtaining low cost, adjustable, values of increased capacitance per unit area, while also maintaining a constant overall dielectric thickness.

9 Claims, 1 Drawing Sheet

METHOD OF MANUFACTURING CAPACITOR DIELECTRIC

FIELD OF THE INVENTION

This invention relates to the fabrication of integrated circuit devices and more particularly to a method for forming a dielectric layer, with an adjustable dielectric constant, K, to be used for the fabrication of capacitor structures that are highly applicable for both memory (such as DRAM) and Logic technologies.

BACKGROUND OF THE INVENTION AND PRIOR ART

The present invention is well suited for both memory and logic technologies. However, for the purposes of discussion, it will be presented in terms of its applicability to Dynamic Random Access Memory (DRAM) technology. As the demand for more semiconductor memory, per chip, has increased, the methods for forming capacitors in DRAM technology have been rapidly evolving. DRAM technology has been and continues to be very well suited for addressing the increasing demand for more storage bits per chip area. However, a number of fundamental limitations have been posing increasingly greater challenges for the continued evolution of DRAMs, as the device dimensions for this popular technology have progressed deeper into the submicron regime. The unit memory cell of a DRAM chip is largely comprised of a single MOS transistor and a single storage capacitor, where the transistor is used as a transfer gate for reading as well as for forcing the charge state of the storage capacitor. The storage capacitor is a critical element of the storage cell. The information state of the memory cell, is determined by whether the stored charge on the storage capacitor is sufficiently above or below a given threshold level. Therefore, proper care must be taken to insure that once the storage capacitor is charged sufficiently above the threshold level, the charge will remain sufficiently above the threshold level until the memory state is deliberately changed by forcing the value of stored charge sufficiently below the threshold level. For example, DRAMs must utilize refresh cycles to compensate for a gradual loss of charge due to leakage current paths, wherein the state of the charge on the storage capacitor is periodically read and then restored (refreshed) back to the nominal value, corresponding to that state. Further more, the amount of stored charge must be sufficiently high, such that a somewhat predictable loss of charge due to a random collision from a high energy particle, such as an alpha particle, will not result in an erroneous information state. Accordingly, the storage capacitance values in DRAM cells cannot be arbitrarily scaled down along with other device dimensions. On the contrary, DRAM designers must maintain a certain minimum value of storage capacitance, in spite of the demand to reduce the amount of surface area that is taken up by the storage capacitor. This has led to innovative storage capacitor structures, where the amount of electrode area lost, by needing to reduce horizontal dimensions, is made up by extending the electrode area in the vertical direction. In addition, increasingly thinner dielectrics have been used to obtain higher values of capacitance per unit area in order to permit desired reductions in electrode area. Unfortunately, as reduced dielectric thickness values have begun to drop down into the tens of angstroms range, the associated adverse impact on yield and reliability, as well as the onset of non-negligible tunneling currents, have tended to impose a fundamental limit on continued reductions in dielectric thickness. This has partly been responsible for the development of advanced stacked dielectric structures made from relatively high dielectric materials, including silicon oxynitride and silicon nitride, in order to obtain increased capacitance per unit area values, relative to dielectric structures employing only silicon oxide as a dielectric.

U.S. Pat. No. 5,455,204 to Dobuzinsky, et. al., teaches a method for forming three-dimensional storage capacitor structures where the dielectric layer is composed of a thin uniform silicon oxynitride film. Uniformity problems, associated with trying to use chemical vapor deposition processes to fill narrow cavernous three-dimensional capacitor electrode structures with dielectric material are overcome by utilizing sequential rapid thermal processing in conjunction with a series of gaseous atmospheres. The end result is a highly uniform thin oxynitride layer which yields good overall electrical properties.

U.S. Pat. No. 5,523,596, to Ohi, et. al., teaches a method for forming a thin dielectric stack, for the formation of storage capacitors, consisting of a bottom silicon oxynitride layer, an overlying silicon nitride layer and a further overlying silicon dioxide layer. This method is taught as an improvement over oxide-nitride-oxide stacks, where the bottom oxide (sometimes a native oxide) tends to become too thick during the heat up time for the formation of the overlying nitride layer. To avoid this problem, the native oxide is first converted to a silicon oxynitride layer. by means of rapid thermal processing in an atmosphere of ammonia. The overlying nitride film is formed by low pressure CVD and the top oxide layer is formed by thermally oxidizing the top portion of the nitride layer in an atmosphere including water vapor. However, similar to Dobuzinsky, et. al., above, this invention does not seem to be particularly applicable for addressing the need for a single CVD process which can be readily tailored for various dialectic constants.

U.S. Pat. No. 5,616,401, to Kobayashi, et. al., teaches a method for forming a silicon oxynitride layer (with a changing composition in the growth direction) and an overlying silicon nitride layer, for the specific purpose of suppressing the well known bird's beak extension during Local Oxidation of Silicon (LOCOS) processing that is often used for electrical device isolation. During the CVD process for the oxynitride layer, the gas composition is gradually changed such that the property of the lower portion is close to silicon dioxide and the property of the upper portion is close to silicon nitride. The lower oxide portion is used to minimize stress at the interface with the underlying silicon while the upper nitride portion is used to provide a diffusion barrier to oxygen for minimizing the bird's beak extension.

U.S. Pat. No. 5,618,747, to Lou, teaches a method for forming a thin oxide-nitride-oxide stack, in conjunction with a polysilicon electrode structure, where the polysilicon deposition temperature is optimized for maximum polysilicon surface roughness. Maximum polysilicon surface roughness is used to obtain increased effective electrode area and, therefore, increased values of capacitance per unit of horizontal electrode area. The method for forming the ONO stack uses three process steps, which are presumed to be rather compatible with a relatively rough polysilicon surface. Again, similar to the above prior art, the complexity and the intent of the solutions that are provided do not appear to be particularly applicable to the need addressed by the present invention. Namely, the need for a one step process, for a thin storage capacitor dielectric that could replace a two step oxide-nitride process, whereby increased capacitance per unit area values could be adjusted while also maintaining a constant film thickness.

SUMMARY OF THE INVENTION

A principle object of the present invention is to provide an effective and manufacturable method for forming a dielectric layer, with an adjustable dielectric constant, K, to be used for the fabrication of electrical capacitors over a semiconductor substrate.

Another object of the present invention is to provide an improved method for replacing a more complicated stacked oxide-nitride dielectric layer with a single Silicon Oxide-OxyNitride, SOON, dielectric layer, which also offers the ability for a relatively high, adjustable dielectric constant.

A further object of the invention is to provide a special CVD method for continuously adjusting the composition of the thin SOON dielectric, in the growth direction.

A still further object of the present invention is to provide a method for adjusting the capacitance per unit area of a storage capacitor, using the SOON dielectric, while holding the thickness of the SOON layer constant.

These objects are achieved by a fabrication method, comprising the steps of: (a) forming a first storage capacitor electrode over a semiconductor substrate; (b) using a CVD process to form a thin oxynitride layer over the first electrode; (c) varying the composition of the oxynitride layer, such that the dielectric property of the lower region is close to silicon oxide, the dielectric property of the upper region is close to silicon oxynitride and the property of the intermediate transition zone is between silicon oxide and oxynitride; (d) adjusting the relative thickness of the transition region in order to change the value of the resultant storage capacitance without having to change the thickness of the oxynitride layer; (e) forming a second capacitor electrode over the graded oxynitride layer; and (f) continuing with conventional processing required for the completion of a functional electrical capacitor structure.

The present invention achieves the above objects by, primarily, utilizing a SOON dielectric layer with three distinct regions that have differing dielectric constants. The SOON layer is formed by means of a special CVD process, whereby the relative concentrations of the oxygen and nitrogen bearing gases are varied during the course of the growth process. A relatively low nitrogen concentration is used for growing the lower region of the layer, a relatively low oxygen concentration is used for growing the upper region of the layer and intermediate concentrations of nitrogen and oxygen are used for growing the intermediate transition zone.

This results in a highly desirable SOON dielectric layer, such that the lower [oxide like] portion exhibits a dielectric constant of about 3.8, the upper [oxynitride like] portion exhibits a dielectric constant of about 5.7 and the intermediate transition zone exhibits a dielectric constant of about 4.9. This improved dielectric formation method also allows the width of the transition zone to be adjusted while holding the overall film thickness constant.

Therefore, the effective dielectric constant of the film can be adjusted by varying the width of the transition zone relative to the overall film thickness. Consequently, an additional advantage is obtained, whereby the capacitance values can be more readily changed, without the need for undesirable process integration issues associated with geometrical changes in overall film thickness and/or electrode area.

BRIEF DESCRIPTION OF THE DRAWINGS

In the accompanying drawings for a material part of this description, there is shown.

DESCRIPTION OF THE PREFERRED EMBODIMENT

It is noted that the following preferred embodiments and associated figures are intended to be presented in a way that can be generally applied to the fabrication of a variety of integrated circuit technologies, such as DRAM and Logic, employing electrical capacitor structures.

Figure 1:
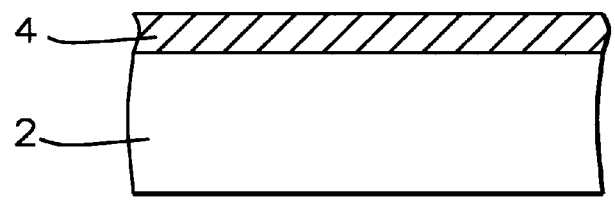
FIGS. 1 to 3 schematically illustrate in cross-sectional representation the preferred embodiments of the process of the present invention.

Referring now more particularly to FIG. 1, there is shown a portion of a partially completed integrated circuit. There is shown a semiconductor substrate 2 intended to represent a conventional first electrode of a capacitor, where the electrode may be formed from crystalline silicon or a first layer of polysilicon. Continuing to refer to FIG. 1, there is also shown a highly doped region 4 for the purpose of increasing the electrical conductivity of all or a portion of the thickness of said substrate 2.

Figure 2:
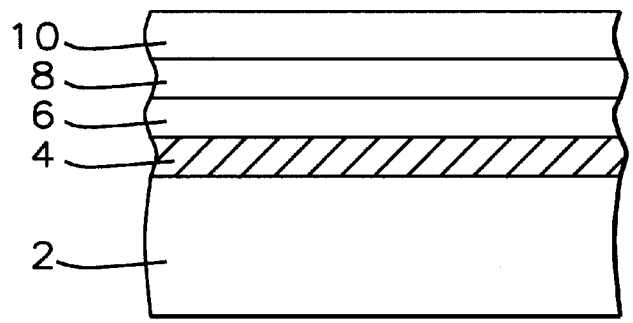

Referring now more particularly to FIG. 2, there is shown an overlying graded Silicon Oxide-OxyNitride, SOON, layer comprised of three distinct regions, 6, 8 and 10 having differing dielectric constants, K. The dielectric property of said region 6 is close to silicon dioxide, the dielectric property of said region 10 is close to silicon oxynitride and the dielectric property of intermediate transition zone 8 is in between silicon oxide and oxynitride. Said regions 6, 8 and 10 are the result of varying the composition of reactant gases during a continuous special CVD process. Said special CVD process is carried out by means of reacting a mixture $S_xH_4$ (Silane), $N_2O$ and $NH_3$. By suitable adjustment of the N20/NH3 gas flow ratio during the process, different compositions of the SOON film are made, where these conditions are common to the formation all said regions 6, 8 and 10.

During the growth of said region 6, said special CVD process settings for determining its composition are typically: Si≈34–38% and O≈62–66% (for the approximate atomic ratio). These settings have yielded a dielectric constant, K, close to silicon dioxide (K≈3.8). It is also noted that said region 6 has a minimum thickness requirement of about 15–50 angstroms, in order to minimize oxide/silicon interface stress. During the growth of said region 8, said special CVD process settings for determining its composition are continually changed as the film thickness increases. This region has yielded a dielectric constant, K, roughly, in between silicon dioxide and silicon oxynitride (K≈4.7–5.1).

During the growth of said region 10, said special CVD process settings for determining its composition are typically: $S_i$≈40–42%, O≈8–10% and N≈48–52% (for the approximate atomic ratios).

Regarding the overall typical thickness values of said regions 6, 8 and 10, it is noted that there are different thickness requirements between Logic and DRAM technologies. For Logic, the overall thickness of the capacitor dielectric is about 100–400 angstroms. For DRAM, the overall thickness of the capacitor dielectric is about 60 angstroms.

Figure 3:
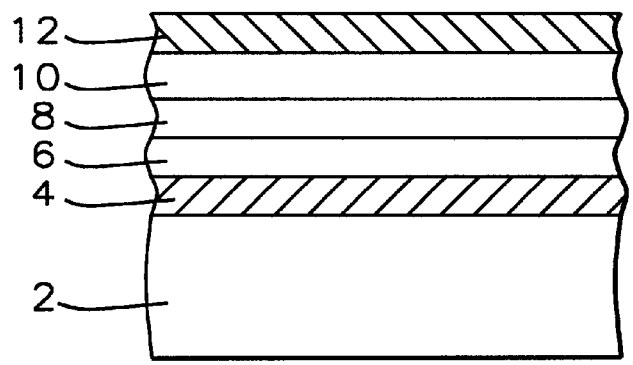

Referring now, more particularly to FIG. 3, conventional processing is used to form an overlying conductive electrode 12 on the surface of said upper dielectric region 10. Said electrode would, typically, be formed from a second layer of highly doped polysilicon.

The objects of the invention have now been accomplished. The aforementioned dielectric capacitance problems have been solved by using said specialized CVD process in order to form a thin graded dielectric layer, comprised of said regions 6, 8 and 10. Accordingly, the present invention solves the need for a one step process that can replace a two step oxide-nitride process, while providing increased capacitance per unit area values that can be adjusted while also maintaining a constant film thickness.

The key to this invention is said special CVD process which is well suited for the formation of thin capacitor dielectric layers, in terms of good thickness control, an adjustable effective dielectric constant, low defect density, high reliability and a good stress related structure.

While the invention has been particularly shown and described with reference to the preferred embodiments thereof, it will be understood by those skilled in the art that various changes in form and details may be made without departing from the spirit and scope of the invention.

What is claimed is:

1. A method for forming storage capacitors, comprised of a, thin graded Silicon Oxide-OxyNitride, SOON, film, having three distinct layered regions with differing dielectric constants, for the purpose of fabricating a capacitor dielectric with an adjustable dielectric constant, comprising the steps of:
   (a) forming the lower 10–15 angstrom region of said SOON film, such that the dielectric constant of said lower region is close to silicon oxide;
   (b) forming an overlying 10–30 angstrom transition zone of said SOON film, such that the dielectric constant of said transition zone is intermediate to silicon oxide and silicon oxynitride;
   (c) forming a further overlying 15–35 angstrom upper region of said SOON film, such the dielectric constant of said upper region is close to that of silicon oxynitride.

2. The method of claim 1 wherein the process for forming said SOON film, is by means of Chemical Vapor Deposition, whereby a mixture of $S_iH_4$ (Silane), $N_2O$ and $NH_3$ is reacted.

3. The method of claim 2 wherein the composition of each of the aforementioned regions of said SOON layer is varied by means of a different $N_2O/NH_3$ gas flow ratio during the process.

4. The method of claim 2, whereby the effective dielectric constant of said Silicon Oxide-OxyNitride, SOON, dielectric used for said capacitor may be adjusted, by means of the $N_2O/HN_3$ gas flow ratio during the process, in order to change said storage capacitance values without changing the overall thickness of said SOON layer, comprising the steps of:
   (a) forming a first high conductivity capacitor electrode over a semiconductor substrate;
   (b) forming the lower region of said SOON dielectric, such that the dielectric constant of said lower region is between about 3.8 and 4.2;
   (c) forming an overlying transition zone of said SOON dielectric, such that the dielectric constant of said transition zone is between about 4.7 and 5.1;
   (d) forming a further overlying upper region of said SOON dielectric, such that the dielectric constant of said upper region is between about 5.7 and 5.9;
   (e) forming a second high conductivity capacitor electrode, overlying said SOON dielectric;
   (f) defining the area of said capacitor structure;
   (g) forming electrical contacts to said capacitor structure.

5. The method of claim 4 wherein said first high conductivity electrode may be comprised of high doped crystalline silicon or a first high doped polysilicon layer.

6. The method of claim 4, wherein the chemical vapor deposition conditions for the formation of said lower region of said SOON dielectric are: $N_2O \approx 3000$ SCCM, $S_iH_4 \approx 80$ SCCM, pressure=250 mTorr and temperature≈700–800° C.

7. The method of claim 4, wherein the chemical vapor deposition conditions for the formation of said transition zone are:

$N_2O \approx 3000-1900$ SCCM, $NH_3 \approx 0-1900$ SCCM, $S_iH_4 \approx 80-320$ SCCM, pressure=250 mTorr and temperature≈700–800° C.

8. The method of claim 4, wherein the chemical vapor deposition conditions for the formation of said upper region are:

$N_2O \approx 1900$ SCCM, $NH_3 1900$ SCCM, $S_iH_4 \approx 320$ SCCM, pressure=250 mTorr and temperature≈700–800° C.

9. The method of claim 4 wherein said second high conductivity electrode may be comprised of a high doped polysilicon layer.

* * * * *